United States Patent [19]
Satomäki

[11] Patent Number: 5,175,510
[45] Date of Patent: Dec. 29, 1992

[54] LOOP FILTER FOR A FREQUENCY SYNTHESIZER

[75] Inventor: Esko Satomäki, Paimio, Finland

[73] Assignee: Nokia Mobile Phones Ltd., Salo, Finland

[21] Appl. No.: 761,971

[22] PCT Filed: Nov. 9, 1990

[86] PCT No.: PCT/FI90/00267
§ 371 Date: Oct. 30, 1991
§ 102(e) Date: Oct. 30, 1991

[87] PCT Pub. No.: WO91/07822
PCT Pub. Date: May 30, 1991

[30] Foreign Application Priority Data
Nov. 9, 1989 [FI] Finland .................... 895353

[51] Int. Cl.⁵ ............... H03L 7/093; H03H 11/12
[52] U.S. Cl. ........................... 331/17; 331/25
[58] Field of Search ..................... 331/17, 25

[56] References Cited
U.S. PATENT DOCUMENTS 4,514,706  4/1985  Thompson ............... 331/17 X
4,742,566  5/1988  Nordholt et al. ......... 331/15 X
4,855,689  8/1989  Kinkel .................... 331/17

FOREIGN PATENT DOCUMENTS 3725732  12/1988  Fed. Rep. of Germany ...... 331/17

Primary Examiner—Siegfried H. Grimm
Attorney, Agent, or Firm—Darby & Darby

[57] ABSTRACT

A loop filter for the feedback branch of a frequency synthesizer includes a low pass filter and an integrator having a first zero point in the frequency response, in order to achieve stability. The frequency response curve of the loop filter contains a second zero point above the characteristic frequency of the loop to increase the phase margin. The loop filter also has a pole at a frequency higher than the first zero point, whereby the influence of the second zero point on the amplitude response is essentially eliminated.

5 Claims, 2 Drawing Sheets

LOOP FILTER FOR A FREQUENCY SYNTHESIZER

BACKGROUND OF THE INVENTION

The object of the present invention is a loop filter situated in the feeback channel of a frequency synthesizer and consisting of an integrator with a zero in the frequency response in order to achieve stability, and of a low pass filter. Such a frequency synthesizer comprising a loop filter known from FIG. 1 is used for example in radio telephones as a local oscillator. In the synthesizer, frequency is formed in a known way according to FIG. 2 in a voltage-controlled oscillator, the frequency of which has been locked to the frequency of a crystal oscillator used as a comparison frequency. The frequencies of the voltage-controlled oscillator and the crystal oscillator are conveyed via dividers to a phase comparator, from the output of which the signal based on the phase or frequency difference is obtained. Generally, at least one of the dividers is then programmable. From the output of the phase comparator, the signal goes to the loop filter, the control voltage of the oscillator being obtainable from the filter.

In a known loop filter a problem is caused by the filtering of sidebands brought about by the comparison frequency while striving for as fast a loop as possible. The reason for the problems is that the poles (on the frequency level) of the low pass filter near the natural frequency of the loop reduce the phase margin, decreasing thus the damping factor.

Attempts have been made to solve the problems by using a low enough natural loop frequency, or by using a separate acceleration coupling. However, in that case, the dimensioning of the components has to be made so precise that even a small tolerance variation in the components causes the setting time to grow too long, or that the sidebands rise too high. A further drawback is the complex structure of the acceleration coupling.

In these known cases, the loop filter has been formed by using an integrator, as can be seen in connection with the operational amplifier V of FIG. 1. In the feedback channel, resistor R1 and condensators C1 and C2 together with input resistor Ri form an integrating factor. Further, an RC-filter is often coupled after the integrator.

SUMMARY OF THE INVENTION

The object of the present invention is to move or essentially reduce the problems and drawbacks mentioned above. In order to achieve this, the invention is characterized in that another zero has been added to the frequency response causing the phase margin to grow; further, a pole has been added at a frequency higher than the zero point, when the impact of the zero on the amplitude response is fundamentally overruled. For example, a bipolar active low pass filter is previously known from an article of D. Kesner: "Take the guesswork out of phase locked loop design," EDN, Jan. 1973, pages 54-60. According to the article, the purpose of the active filter is to replace the RC-filtering following the integrator in order to remove sidebands. In the present invention, the frequency response of the integrator is changed so that the phase margin grows and the sideband filtering can be achieved by RC-filtering.

A multipolar loop filter is also known from a publication of J. Gorski-Popiel: "Phase-locked Loop Frequency Synthesizer," IEEE Press, 1975, Frequency Synthesis: Techniques and Applications, pages 111–118. This filter with no zero in the frequency response contains a block (T1), the purpose of which is to totally overrule the effect of RC-circuits in the filter output.

According to the present invention, the impact of the RC-circuits on the phase is reduced at the loop cut-off frequency. The loop of a frequency synthesizer, including the loop filter of the present invention, becomes faster, and at the same time, it is still possible to effectively filter sidebands. Additionally, the loop can be planned as less critical in relation to the tolerance of the components.

BRIEF DESCRIPTION OF THE DRAWINGS

The present invention will now be described by way of an exemplary embodiment and with reference to the accompanying drawings of which.

DESCRIPTION OF THE EXEMPLARY EMBODIMENT

The phase margin of the frequency synthesizer mentioned in the introduction can be increased when, according to the present invention, a zero is added to the frequency response (transfer function on the frequency level) above the natural loop frequency. The effect of the zero on the amplitude response is reversed with a pole situated at a frequency above the zero point.

Figure 1:
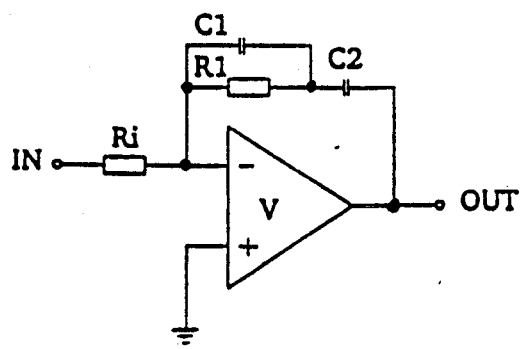
FIG. 1 is a realization of a previously known loop filter.
Figure 2:
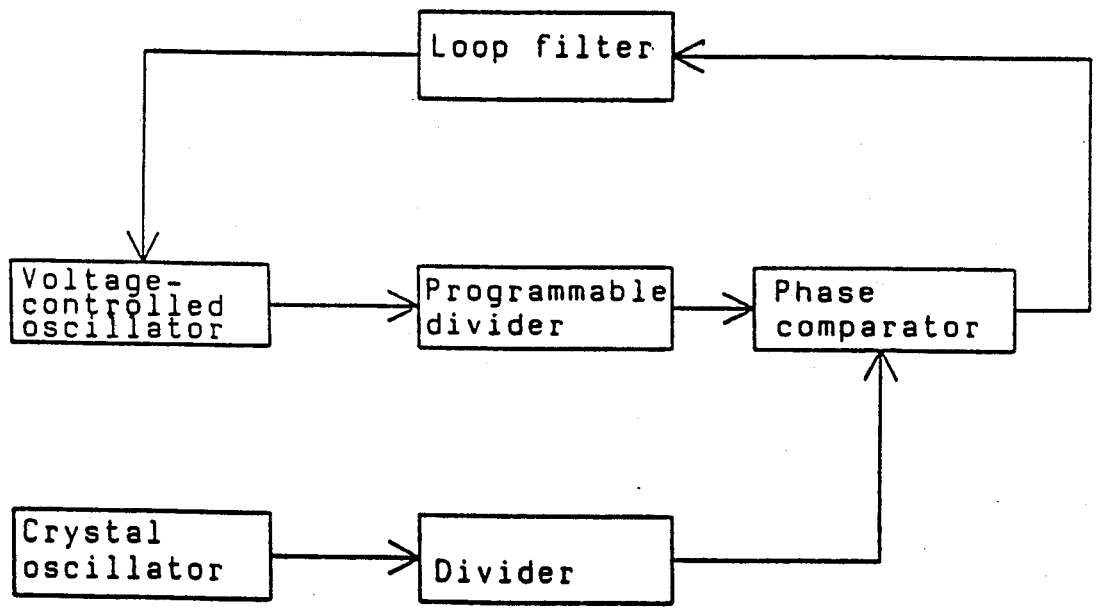
FIG. 2 is a block diagram of the structure of a known frequency synthesizer.
Figure 3:
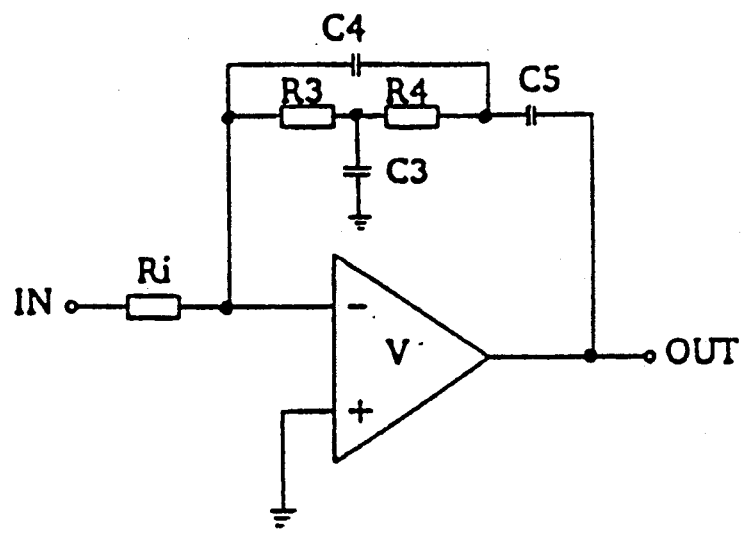
FIG. 3 shows the construction of an embodiment of a loop filter of the present invention.

An increase in the phase margin can be exploited by dimensioning the natural loop frequency and the poles of the low pass filter closer to each other on the frequency level. In practice this means that the loop can be made much faster, and it still is possible to effectively filter out sidebands. At the same time, the loop can be planned as less critical in relation to the tolerance of the components. The desired change in the frequency response, i.e. adding of a zero, is achieved by adding two components to the feedback channel of a known loop filter (FIG. 1), as can be seen in FIG. 3. Instead of resistor R1 of FIG. 1, resistors R3 and R4 and condensator C3 are arranged in a T-coupling.

Response of the filter embodiment of FIG. 3 is $$F(s) = \frac{1 + s(C_5R_3 + C_5R_4 + C_4R_3 + C_4R_4 + C_3R_3) + s^2(C_5C_3R_3R_4 + C_4C_3R_3R_4)}{s(C_5R_1) + s^2(C_5C_4R_1R_3 + C_5C_4R_1R_4) + s^3(C_5C_4C_3R_1R_3R_4)}$$

or, $$F(s) = \frac{B_2s^2 + B_1s + B_0}{A_3s^3 + A_2s^2 + A_1s}$$

Figure 4:
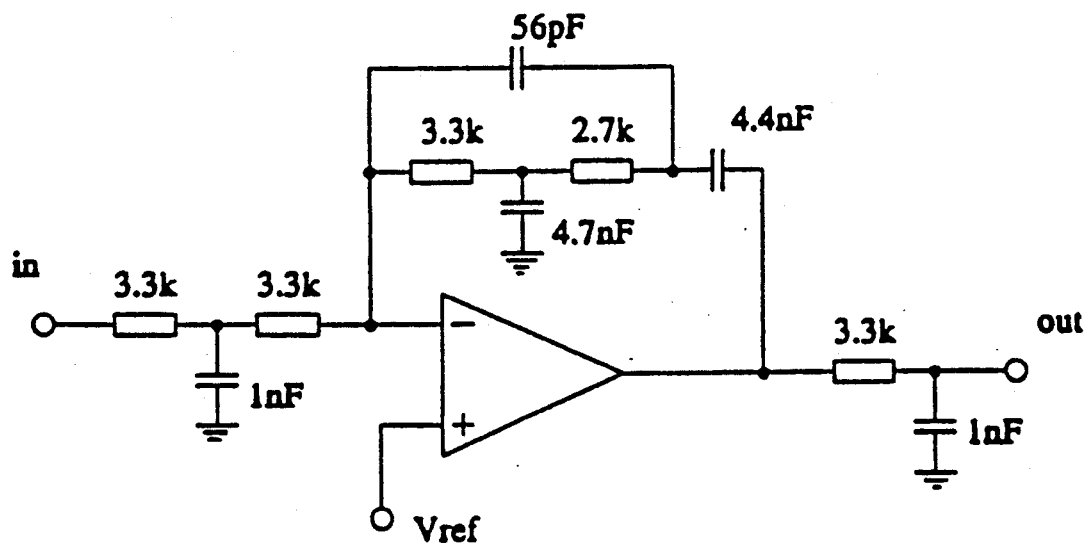
FIG. 4 shows the component values of the embodiment in question.

This equation shows only the effect of the integrator in the loop filter. When the RC-circuits typically used are added, the performance number of the denominator increases correspondingly. For example, the number increased by two RC:s as in FIG. 4; one before the integrator and the one after, so the performance number of the denominator is then five. However, the performance number of the numenator will still be two.

The response will then be in the following form:

$$F(s) = \frac{B_2 s^2 + B_1 s + B_0}{s^5 + A_4 s^4 + A_3 s^3 + A_2 s^2 + A_1 s + A_0}$$

In known loop filters, a zero below the loop cut-off frequency is generally at the frequency having the magnitude of/5. This zero is necessary in order to make the loop generally stable.

According to the present invention, the other zero added to the frequency response lies above the loop cut-off frequency, at the most 2.of. If the zero lies too near the cut-off frequency it has an impact on the amplitude response, and if it is too far, the impact on the phase response is lost.

The impact of the zero is overruled by a pole produced by the RC-circuits which is at a higher frequency, perhaps about one and a half times higher in comparison with the frequency of the zero. In order to filter sidebands, it is usually most advantageous to use the cut-off frequency of the low pass filter which is the geometrical average of the cut-off frequency and the reference frequency.

Frequencies of the filter in the embodiment are approximately:

| | |
|---|---|
| Integrator zero: | 3.7 kHz |
| Added zero: | 31 kHz |
| Integrator pole: | 9 kHz |
| Low pass filter poles: | 41 kHz |
| Cut-off frequency fo of the whole loop about | 15-20 kHz |

The idea of the loop filter of the invention is that the zero added to the response changes the phase margin exactly at the natural loop frequency, i.e. the phase margin is delivered to the frequency response exactly at the right frequency by a simple coupling; a passive low pass filter can then be used in filtering sidebands.

The desired frequency response achieved according to the invention by adding another zero and pole can be realized with several different filter couplings, as will undoubtedly occur to a professional in the field when viewing the ideas of the present invention.

I claim:

1. Loop filter situated in the feedback branch of the frequency synthesizer, said loop filter comprising an integrator with a zero point int eh frequency response in order to achieve stability, and a low pass filter, characterized in that to the frequency response curve of the loop filter there has been added

- a second zero point above the characteristic frequency of the loop, thus increasing the phase margin, and
- a pole at a frequency higher than the first-mentioned zero point, whereby the influence of the added second zero point on the amplitude response is essentially eliminated.

2. A loop filter according to claim 1, characterized in that the added second zero point is produced by additional components of the integrator feedback branch and that the added pole is produced by an RC-circuit before and/or after the integrator.

3. A loop filter according to claim 1 or 2, characterized in that the added second zero point is at a frequency which is about one and a half times the loop cut-off frequency.

4. A loop filter according to claim 3, characterized in that the added pole lies at a frequency which is about one and a half times the frequency of the added second zero point.

5. Use of a loop filter according to claim 1 in a local oscillator of a radio telephone.

* * * * *